US008218275B2

(12) United States Patent
Martin et al.

(10) Patent No.: US 8,218,275 B2
(45) Date of Patent: Jul. 10, 2012

(54) ESD PROTECTION FOR PASS-TRANSISTORS IN A VOLTAGE REGULATOR

(75) Inventors: Maximilliaan Lambertus Martin, Wijchen (NL); Yorgos Christoforou, Arnhem (NL); Johannes Van Zwol, Beek-Ubbergen (NL)

(73) Assignee: NXP B.V., Eindhoven (NL)

( * ) Notice: Subject to any disclaimer, the term of this patent is extended or adjusted under 35 U.S.C. 154(b) by 673 days.

(21) Appl. No.: 12/090,703

(22) PCT Filed: Sep. 26, 2006

(86) PCT No.: PCT/IB2006/053499
§ 371 (c)(1),
(2), (4) Date: Aug. 15, 2008

(87) PCT Pub. No.: WO2007/046015
PCT Pub. Date: Apr. 26, 2007

(65) Prior Publication Data
US 2008/0316663 A1    Dec. 25, 2008

(30) Foreign Application Priority Data
Oct. 21, 2005    (EP) .................................... 05109827

(51) Int. Cl.
*H02H 9/04* (2006.01)
*H02H 3/22* (2006.01)

(52) U.S. Cl. ............. 361/56; 361/111; 361/152; 361/54
(58) Field of Classification Search .................... 361/56, 361/111, 152, 54
See application file for complete search history.

(56) References Cited

U.S. PATENT DOCUMENTS

| 6,125,021 A * | 9/2000 | Duvvury et al. ............... 361/56 |
| 6,246,555 B1 | 6/2001 | Tham |
| 6,614,633 B1 * | 9/2003 | Kohno ........................... 361/56 |
| 6,678,130 B2 * | 1/2004 | Ratner et al. .................. 361/18 |
| 6,703,813 B1 | 3/2004 | Vladislav et al. |
| 2002/0171984 A1 | 11/2002 | Ratner et al. |

FOREIGN PATENT DOCUMENTS
WO    9618938 A1    6/1996
* cited by examiner

*Primary Examiner* — Rexford Barnie
*Assistant Examiner* — Zeev V Kitov

(57) ABSTRACT

Present invention relates to an electrostatic discharge protection circuit for a transistor circuit having electrostatic discharge protection circuits coupled to an input and to an output terminal. The protection circuits comprise delay means having a predetermined delay time and switchable connecting means connected between said input terminal and a control terminal of said transistor circuit. The delay means are configured for activating said switchable connecting means for said predetermined delay time in response to an electrostatic discharge at said input terminal.

10 Claims, 3 Drawing Sheets

ESD PROTECTION FOR PASS-TRANSISTORS IN A VOLTAGE REGULATOR

The present invention relates to electrostatic discharge protection circuit, and to method for protecting a pass-transistor.

ESD Event, or Electrostatic Discharge, is an electromagnetic phenomenon, in particular one of the most important types of failure mechanisms in the microelectronics industry. ESD damage is usually caused by one of the following events: direct electrostatic discharge to the device, electrostatic discharge from the device, or field induced discharges. Several hundreds of million of dollars are spent every year for prevention or compensation of ESD phenomena during IC fabrication, assembly or even field use. When an ESD event occurs, it generates both electric and magnetic fields. Electric field is generated due to sharp reduction of static voltage that caused the ESD event. The current produced during the event generates the magnetic field. Combined, both form an electromagnetic field. ESD events are very short (down to few nanoseconds), meaning that the frequency spectrum they generate is very broad. This spectrum mostly extends towards high frequencies, e.g. as high as 5 GHz or more.

Accordingly, from a design point of view, ESD protections are always included in the Input/Output (IO) cells that serve communication from the die to the outside world. This way around 80% of the ESD cases are secured. Nevertheless, a certain ESD weakness needs special care, which, for instance, may appear in linear regulators, which are very important building blocks for power management units.

FIG. 1 shows a typical topology of a linear regulator 100. Such a voltage regulator is used for reduction of fluctuations in power supply to a chip, which can adversely affect the performance of an integrated circuit. The regulator is to maintain a steady and stable voltage for power supply, for instance, on a chip. For that purpose, the regulator 100 may comprise two main building blocks, one high-gain amplifier 110 and one pass-transistor 120. An unregulated supply voltage Vin is connected to a regulator input pin 101, which is connected to a regulator output pin 102 via the pass-transistor 120. Thus, the input voltage at input 101 can be controlled by means of the pass-transistor 120 by supplying the correct amount of current to a load connected to the regulator output pin 102 to keep the output voltage Vout stable. Both input pin 101 and output pin 102 are protected by respective ESD protection elements 131, 132, which basically are arranged for diverting ESD events at the input pin 101 or the output pin 102, respectively, to ground of the regulator circuit 100. To control the output voltage Vout, the amplifier 110 compares a reference voltage at a first amplifier input 111 with the actual output voltage Vout of the regulator 100, which is represented by a voltage at a second amplifier input 112. A voltage divider comprising a first resistor R1 and a second resistor R2 senses the actual output voltage. The gate of the pass-transistor 120 is connected to the output 113 of the amplifier 110 and controlled by thereby setting the gate voltage of the pass-transistor 120.

During ESD qualification, a product as the regulator 100 is stressed in all possible combinations of its pins, for instance, according to the class 2 of the JEDEC standard. JEDEC is the Solid State Technology Association (once known as the Joint Electron Device Engineering Council). Accordingly, for the linear regulator 100, shown in FIG. 1, there are 4 possible combinations for the input pin 101 and the output pin 102 with respect to an ESD event. These combinations can be assigned to two general groups.

Into the first group of ESD events belong the situations where an ESD occurs at one of the regulator input 101 or output 102 and goes to ground of the regulator circuit. Both possible combinations are very similar and robustness as well as effectivity depends strongly on the technology used to implement the ESD protections 131, 132 at the respective pins 101, 102 of the regulator 100.

The second group of ESD events can be characterized by the ESD event passing through the regulator 100 via the pass-transistor 120 from the regulator input 101 to the regulator output 102, or vice versa. Here, the dimension of the pass-transistor 120 will be the important and deciding factor whether the regulator 100 will survive the ESD event or not. In the case that the ESD impulse crosses the pass-transistor 120 from the regulator output pin 102 towards the regulator input pin 102, the ESD impulse can travel through the back-gate diode 122, which is a parasitic component of the pass-transistor 120. That is if the back-gate diode 122 is big enough then the pass-transistor 120 will survive, if not it will be destroyed. For average dimensions of a pass-transistor implemented as metal oxide semiconductor transistor (MOST), e.g. about 200 μm, there will always be some risk whether the MOST will survive or not.

Therefore, Transmission Line Impulse (TLP) measurements are important for characterizing the ESD behavior of the MOST. Such a TLP I/V diagram is shown in FIG. 2, for the ESD path through the parasitic MOST back-gate diode 122. From the diagram of FIG. 2 it is obvious that the back-gate diode of a medium size p-channel MOST (a pMOST for short) is robust enough to survive such an ESD event.

Nevertheless, there is one case in which the MOST may be severely damaged, namely when the ESD impulse at the source of the MOST is coupled to the gate G of the pMOST, i.e. the pass-transistor 120. This is mainly due to the gate-source overlap capacitor CGS, which is indicated in FIG. 1 by dashed lines. A first consequence is that the voltage for which the pMOST will go into snapback is lowered; snapback is a phenomenon that occurs in ESD protection devices and which has an important effect on ESD immunity; for short, the behavior of the MOST comprises a first linear region followed by a saturation region which is followed by an avalanche breakdown region, after which comes the bipolar or so-called snapback region. A second consequence is that the pMOST will be turned on. As a result, during an ESD event the pMOST will conduct ESD driven/caused current under normal MOST operation conditions.

FIG. 3 shows the respective I/V characteristic out of a TLP measurement for the afore-mentioned critical ESD path. In the area referenced by letter A, the MOST turns in ON-state, i.e. the MOST conducting mode. In the area referenced by letter B, the ESD protection turns ON. And finally, in the area referenced by C of the I/V characteristic, the pass-transistor has been destroyed. For example, in the regulator 100 of FIG. 1 this may result in that one of the fingers of the MOST will break down under the high ESD current pressure. In particular, the inventors have analyzed samples and have found holes on the silicon at the drain-gate area caused by the ESD event.

It is therefore an objective of the present invention to provide an improved ESD protection to circuits.

This objective is achieved by an electrostatic discharge protection circuit for a transistor circuit having electrostatic discharge protection circuits connected to an input and to an output terminal, the protection circuit comprising delay means with a predetermined delay time and switchable connecting means connected between the input terminal and a control terminal of the transistor circuit, wherein the delay means are configured to activate the switchable connecting means for the predetermined delay time in response to an electrostatic discharge at the input terminal.

The above-mentioned objective is further achieved by a method, said method for protecting a pass-transistor circuit protected by electrostatic protection means at a source terminal and a drain terminal against conducting of current driven by a electrostatic discharge at the source terminal, the method comprising preventing the pass-transistor circuit from conducting by connecting a gate terminal of the transistor circuit with the source terminal until the electrostatic protection means start conducting the current driven by the electrostatic discharge at the source terminal.

According to an embodiment of the invention the transistor circuit is a field effect transistor, in particular a metal oxide semiconductor transistor. Further, the pass-transistor may be arranged for control of a current as in a voltage regulator circuit.

Preferably, the delay means may comprise a resistor and a capacitor. Thus the delay time may easily be designed as the product of the resistance of the resistor and the capacitance of the capacitor. The delay means are connected between a source and a gate of the field effect transistor. The delay time is preferably greater than a delay time of the electrostatic discharge protection means. Preferably, the switchable connecting means are at least a second transistor circuit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are merely intended to conceptually illustrate the structures and procedures described herein, which mainly are intended to give a picture of how the invention works and how the invention may be implemented.

Figure 4:
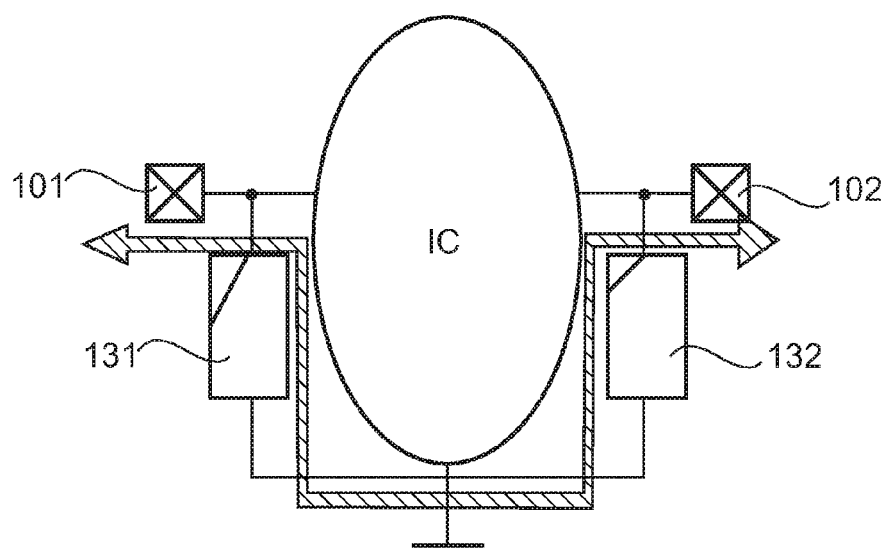
FIG. 4 illustrates the general idea of the present invention for an improved ESD protection.

FIG. 4 illustrates the general idea of the invention which is based on the principle that all or at least most of the ESD current between two pins of an IC passes though a pre-designed, well-controlled current path. Preferably, that path is placed on the die (in terms of circuitry) only for this purpose. With respect to the critical ESD current path discussed above as an example for the use of the present invention the path should be as illustrated in FIG. 4. Accordingly, the ESD impulse between any 2 pins of the IC is directed from one pin to the other through the, for this reason developed, ESD protection and then the ground, leaving the rest of the IC intact. In the example of the linear regulator 100 of FIG. 1 discussed above as an example, this does not happen, mainly because of the capacitive gate-source coupling by the parasitic capacity CGS, the pass-transistor 120 turns ON and starts conducting ESD current.

Figure 1:
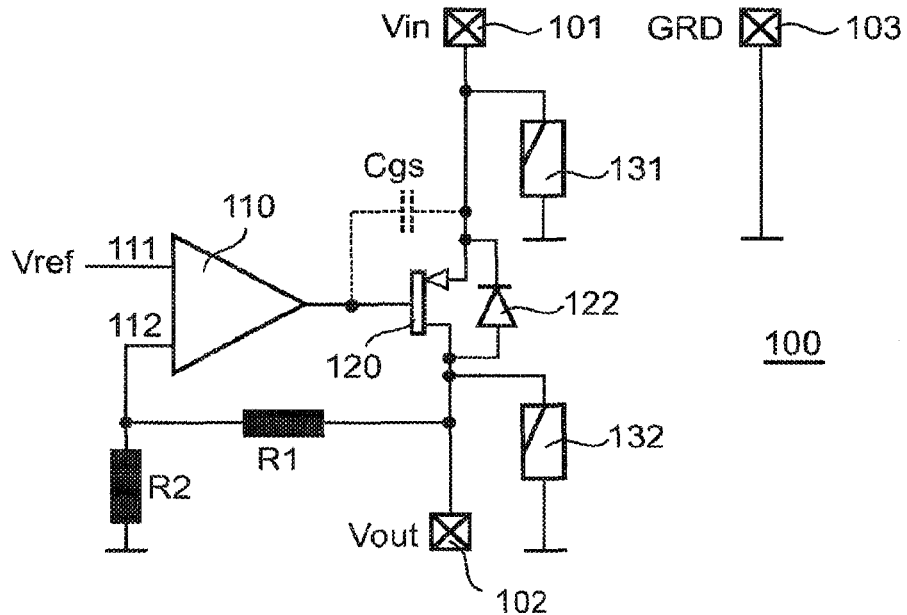
FIG. 1 shows a voltage regulator circuit with ESD protections at the input and output according to the prior art.
Figure 2:
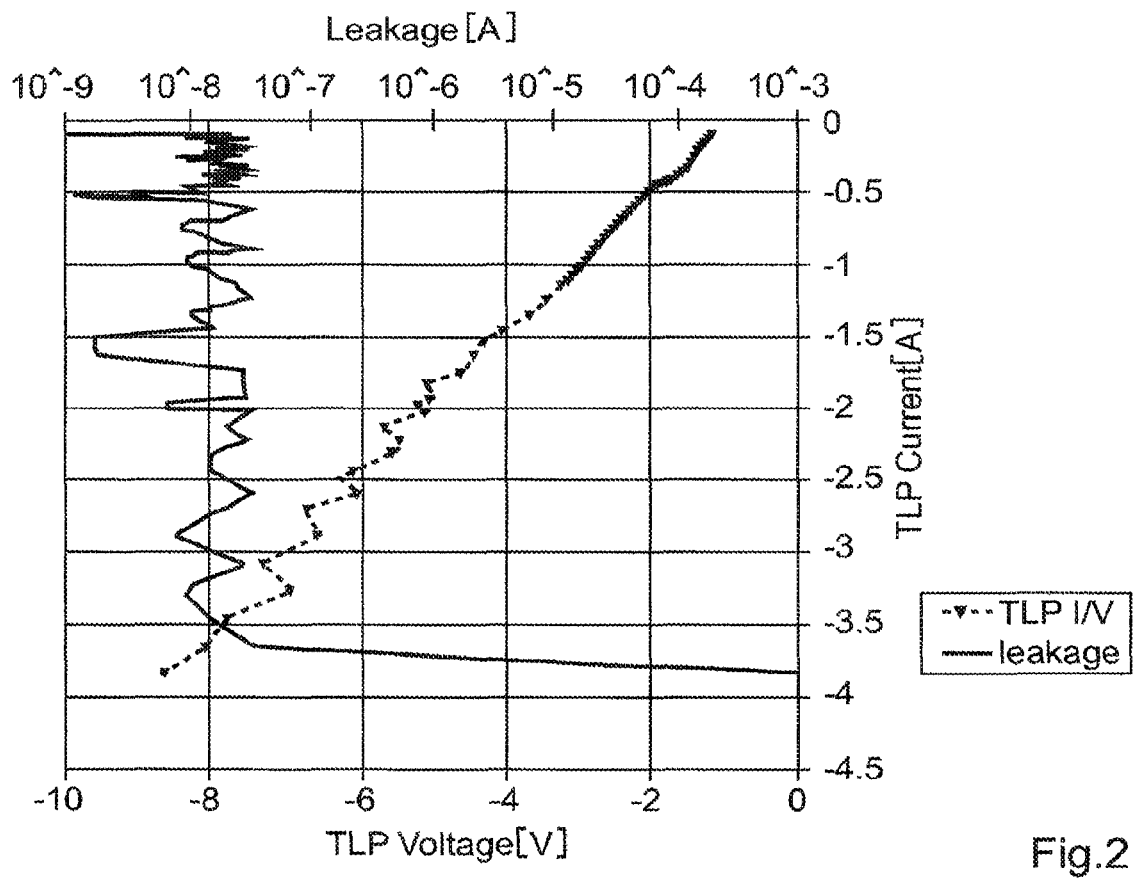
FIG. 2 is a TLP I/V diagram for the ESD path through the parasitic MOST back-gate diode of the regulator circuit of FIG. 1.
Figure 3:
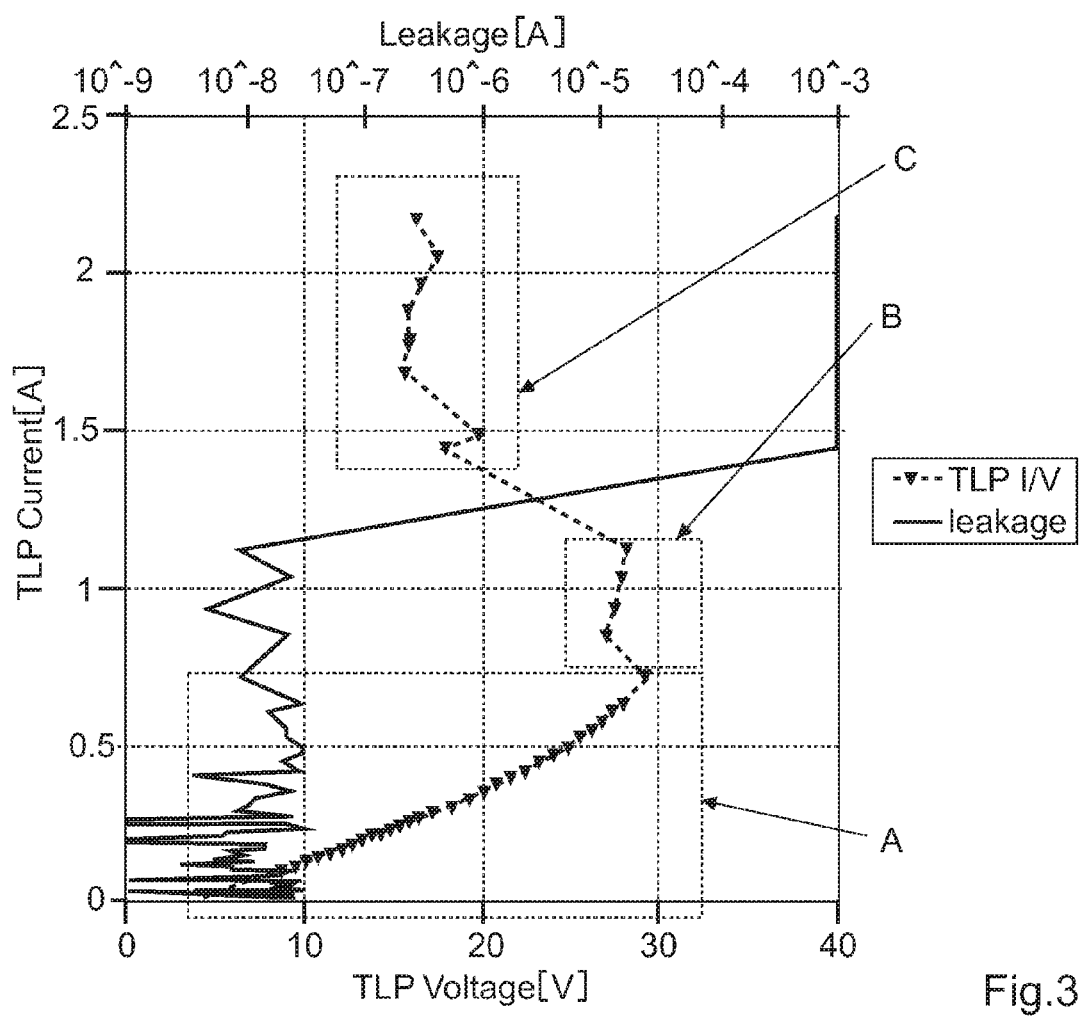
FIG. 3 is TLP I/V diagram for the critical ESD path of the regulator circuit of FIG. 1.

According to example of the voltage regulator 100 of FIG. 1, the ESD protections 131 and 132 around the pass-transistor 120 of the regulator 100 are designed so that they will turn ON in a fixed ESD voltage appearing at their terminals, i.e. at the input pin 101 and/or the output pin 102. In the example of the regulator, the protection at the input does turn ON but very late, since the pass-transistor 120 is already conducting.

According to the general idea of invention, the pass-transistor 120 is made to be OFF, i.e. not conducting, during an ESD event. Then, the ESD protection will turn ON first and hence can absorb the majority of the ESD current. As a result, the pass-transistor 120 is saved. In other words the invention proposes to keep the pMOST pass-transistor 120 OFF during the ESD event, so that most of the current is absorbed from the, for this reason designed, ESD protection, which may be an ESD protection diode.

Figure 5:
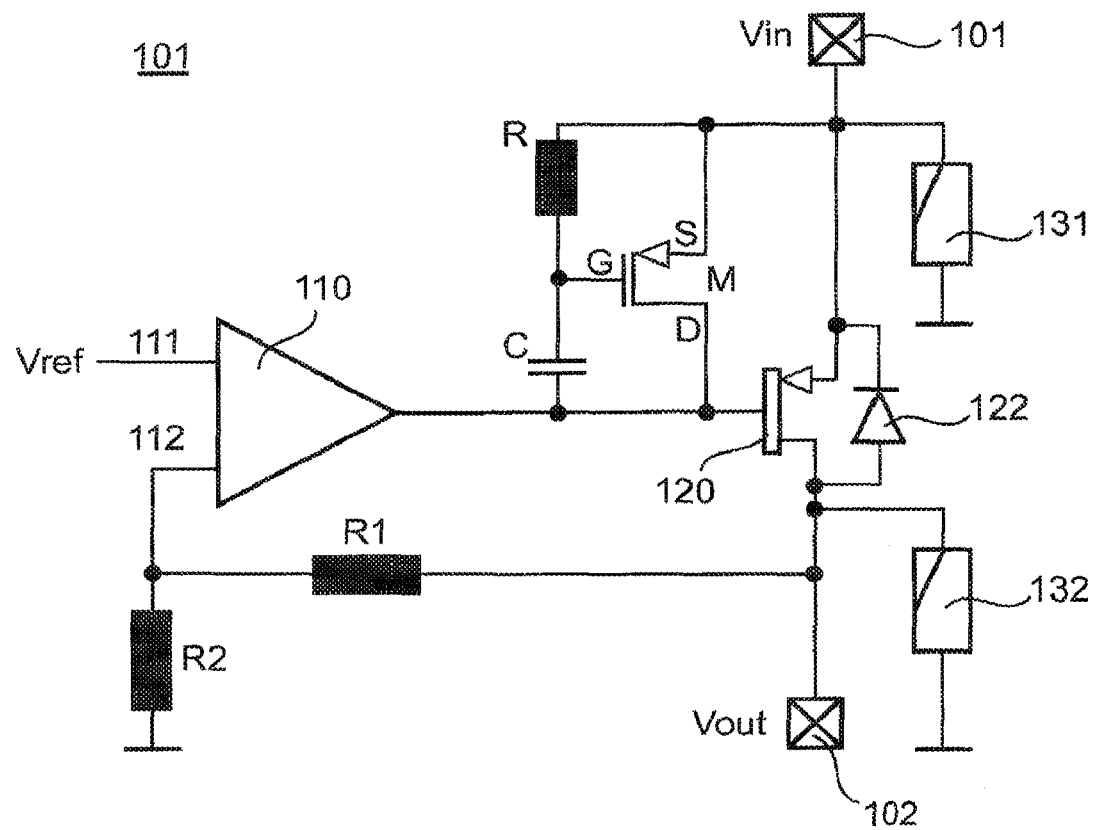
FIG. 5 shows an embodiment of the present invention implemented in the voltage regulator of FIG. 1.

With respect to the introductory example, i.e. the voltage regulator 100 of FIG. 1, the present invention can be implemented as a design addition at the source side of the pMOST pass-transistor 120. A respective embodiment of the invention is shown in FIG. 5. It is to be noted that only the differences with respect to the present invention between FIGS. 1 and 5 will be discussed and described in the following.

In FIG. 5, there is a RC circuit comprising a capacitor C and a resistor R, followed by a transistor M, which is also a pMOST. The function of the design addition according to the present invention is to sense the ESD event and short the gate of the pass-transistor 120 to the source, turning this way the pMOST pass-transistor 120 OFF. The RC time constant defined by the capacitor C and the resistor R is preferably configured to be greater than the RC constant of the ESD event, which is generally about 1 μs. Preferably, the resistor R is configured such that the driving current for the transistor M is enough to be able to quickly, e.g. in about ins, charge the gate of the pass-transistor 120, which being of medium dimensions, corresponds to eventually a capacitance of around 5 pF to 10 pF.

Simulations of the design addition according to the present invention have shown the effectiveness of the present invention to the ESD behavior of the pass-transistor 120. In the regulator circuit 100 of FIG. 1, the gate-source voltage at the gate of the pass-transistor 120 stays at a high value for quite a long time. After the modification according to the invention, the gate-source voltage of the regulator 101 of FIG. 5 falls very fast down to almost zero, whereby the pass-transistor 120 is switched OFF. Additionally, in the design of FIG. 1, the ESD current crossing the pass-transistor 120 stayed at an average value of 0.5 A for around 3 us which is three times longer than the duration of the ESD event. With the present invention, the current is reduced to nearly zero in less than about 10 ns.

For a simulation of the regulator circuit 101 of FIG. 5 a 2 pF Ppoly-HPW capacitor as the capacitor C and a 100 kΩ Ppoly resistor as the resistor R have been used to implement the RC constant. Further, a minimal length MOST has been used for to driving the gate of the pass-transistor 120. When the ESD event arrives at the source of the pass-transistor 120 it is sensed by the resistor R and charges the capacitor C up to the source voltage. The capacitor C stays at this value as long as the ESD impulse is present at the source of the pass-transistor 120, which is about 1 μs. The charging voltage turns the pMOST transistor M ON, which then shorts the gate of the pass-transistor 120 to its source during the whole duration of the ESD event.

By the present invention an improvement to electrostatic discharge protection for a pass-transistor has been disclosed. The pass-transistor has electrostatic discharge protection means at its source and drain terminals, which, however, can not prevent the pass-transistor from conducting electrostatic discharge current from the source towards the drain. According to the present invention, the improvement comprises a resistor-capacitor combination with a predetermined delay time and a second transistor as switchable connection between the source terminal and the gate terminal of the pass-transistor. By configuration of the resistor-capacitor combination such that the second transistor short-connects the source and the gate terminal of the pass-transistor for the predetermined delay time in reaction to an electrostatic discharge at the input terminal, the pass-transistor can be prevented from conducting current driven by an electrostatic discharge. An example for use of the invention has been given by a voltage regulator circuit which comprises the pass-transistor as current control element. It will be appreciated that the invention can be advantageously be used in any ESD sensitive application where medium sized pass-transistors are used. For example, such applications appear very often in automotive ICs, power ICs, power management ICs, instrumentation sensors or alike.

The invention claimed is:

1. An electrostatic discharge protection circuit for a transistor circuit having electrostatic discharge protection elements coupled to an input terminal of the electrostatic discharge protection circuit that is connected to a supply voltage and to an output terminal of the electrostatic discharge protection circuit, the electrostatic discharge protection circuit comprising a resistor and a capacitor having a predetermined delay time that corresponds to a product of the resistance of the resistor and the capacitance of the capacitor and a second transistor circuit, wherein the electrostatic discharge protection circuit is configured to sense an electrostatic discharge at the input terminal of the electrostatic discharge protection circuit and to short a gate terminal of the transistor circuit to a source terminal of the transistor circuit such that the transistor circuit is turned off during the electrostatic discharge, wherein the input terminal of the electrostatic discharge protection circuit that is connected to the supply voltage is connected to the gate terminal of the transistor circuit through the resistor and the capacitor and through the second transistor circuit, wherein the resistor and the capacitor are configured for activating the second transistor circuit for the predetermined delay time in response to the electrostatic discharge at the input terminal of the electrostatic discharge protection circuit, wherein the resistor and the capacitor are connected in series between the input terminal of the electrostatic discharge protection circuit and the gate terminal of the transistor circuit such that the resistor is directly connected to a gate terminal and a source terminal of the second transistor circuit and the input terminal of the electrostatic discharge protection circuit and the capacitor is directly connected to the gate terminal and a drain terminal of the second transistor circuit and the gate terminal of the transistor circuit, wherein the source terminal of the second transistor circuit is directly connected to the input terminal of the electrostatic discharge protection circuit, and wherein the drain terminal of the second transistor circuit is directly connected to the gate terminal of the transistor circuit.

2. The electrostatic discharge protection circuit according to claim 1, wherein the transistor circuit is a field effect transistor, in particular a metal oxide semiconductor transistor.

3. The electrostatic discharge protection circuit according to claim 2, wherein the field effect transistor is a pass-transistor arranged for control of a current in a voltage regulator circuit.

4. The electrostatic discharge protection circuit according to claim 1, wherein the predetermined delay time is greater than the duration of the electrostatic discharge at the input terminal of the electrostatic discharge protection circuit.

5. A method for protecting a pass-transistor circuit protected by an electrostatic discharge protection circuit comprising electrostatic discharge protection elements at a source terminal of the pass-transistor circuit that is connected to a supply voltage and a drain terminal of the pass-transistor circuit against conducting of current driven by an electrostatic discharge at the source terminal of the pass-transistor circuit, the method comprising the steps of connecting a gate terminal of the pass-transistor circuit with the source terminal of the pass-transistor circuit that is connected to the supply voltage by way of a resistor and a capacitor having a predetermined delay time that corresponds to a product of the resistance of the resistor and the capacitance of the capacitor and a second transistor circuit until the electrostatic discharge protection circuit starts conducting the current driven by the electrostatic discharge at the source terminal of the pass-transistor circuit for preventing the pass-transistor circuit from conducting, wherein an input terminal of the electrostatic discharge protection circuit that is connected to the supply voltage is connected to the gate terminal of the pass-transistor circuit through the resistor and the capacitor and through the second transistor circuit, wherein the resistor and the capacitor are connected in series between the input terminal of the electrostatic discharge protection circuit and the gate terminal of the pass-transistor circuit such that the resistor is directly connected to a gate terminal and a source terminal of the second transistor circuit and the input terminal of the electrostatic discharge protection circuit and the capacitor is directly connected to the gate terminal and a drain terminal of the second transistor circuit and the gate terminal of the pass-transistor circuit, wherein the source terminal of the second transistor circuit is directly connected to the input terminal of the electrostatic discharge protection circuit, and wherein the drain terminal of the second transistor circuit is directly connected to the gate terminal of the pass-transistor circuit.

6. The method according to claim 5, wherein the predetermined delay time is greater than the duration of the electrostatic discharge at the input terminal of the electrostatic discharge protection circuit.

7. The method according to claim 5, wherein the pass-transistor circuit is a field effect transistor, in particular a metal oxide semiconductor transistor.

8. The method according to claim 7, wherein the field effect transistor is a pass-transistor arranged for control of a current in a voltage regulator circuit.

9. The electrostatic discharge protection circuit of claim 1, wherein the transistor circuit and the second transistor circuit are p-channel metal oxide semiconductor transistors.

10. The method of claim 5, wherein the pass-transistor circuit and the second transistor circuit are p-channel metal oxide semiconductor transistors.

* * * * *